(12) United States Patent
Hänel (10) Patent No.: US 9,120,623 B2
(45) Date of Patent: Sep. 1, 2015

(54) STORAGE SHELF SYSTEM FOR STORING STORAGE GOODS

(75) Inventor: Joachim Hänel, Bad Friedrichshall (DE)

(73) Assignee: Hänel & Co. (CH)

( * ) Notice: Subject to any disclaimer, the term of this patent is extended or adjusted under 35 U.S.C. 154(b) by 0 days.

(21) Appl. No.: 13/818,579

(22) PCT Filed: Jul. 11, 2011

(86) PCT No.: PCT/EP2011/061774
§ 371 (c)(1),
(2), (4) Date: Mar. 25, 2013

(87) PCT Pub. No.: WO2012/025290
PCT Pub. Date: Mar. 1, 2012

(65) Prior Publication Data
US 2013/0223961 A1    Aug. 29, 2013

(30) Foreign Application Priority Data
Aug. 24, 2010 (DE) .......................... 10 2010 035 231

(51) Int. Cl.
*B65G 1/127* (2006.01)
*H01L 21/677* (2006.01)

(52) U.S. Cl.
CPC ........... *B65G 1/127* (2013.01); *H01L 21/67733* (2013.01)

(58) Field of Classification Search
CPC .. B65G 1/127; B65G 1/045; H01L 21/67733; H01L 21/67736; H01L 21/67769
USPC ........................................ 414/331.01–331.18
See application file for complete search history.

(56) References Cited

U.S. PATENT DOCUMENTS

| | | |
|---|---|---|
| 5,595,263 A | 1/1997 | Pignataro |
| 7,181,313 B2 * | 2/2007 | Studebaker et al. .......... 700/214 |
| 7,210,889 B2 * | 5/2007 | McFarland ............... 414/331.02 |
| 2002/0106271 A1 * | 8/2002 | Remericq ............... 414/331.04 |

(Continued)

FOREIGN PATENT DOCUMENTS

| | | |
|---|---|---|
| CN | 101784465 A | 7/2010 |
| DE | 21 14 962 B1 | 8/1972 |

(Continued)

OTHER PUBLICATIONS

International Search Report for PCT/EP2011/061774 completed on Oct. 26, 2011.

(Continued)

*Primary Examiner* — Saul Rodriguez
*Assistant Examiner* — Emery Hassan
(74) *Attorney, Agent, or Firm* — Thomas B. Ryan; Harter Secrest & Emery LLP (57) ABSTRACT

The invention relates to a storage shelf system (10) for storing storage goods, comprising at least one service opening (18) for introducing and for removing storage goods, at least one revolving storage shelf unit (20, 30) having a plurality of storage locations and at least one storage shelf unit (40) which has at least one shelving column having storage locations disposed one above the other. The invention further relates to a transfer device (60) for transporting the storage goods (12) from a storage location in the storage shelf unit (40) to a storage location in the revolving storage shelf unit (20, 30) and vice versa.

21 Claims, 9 Drawing Sheets

(56) References Cited

U.S. PATENT DOCUMENTS

| | | | |
|---|---|---|---|
| 2003/0002961 A1* | 1/2003 | Davis et al. | 414/217.1 |
| 2003/0044262 A1* | 3/2003 | Inui | 414/331.01 |
| 2004/0101386 A1 | 5/2004 | Robey | |
| 2007/0124022 A1* | 5/2007 | Hasenfratz et al. | 700/243 |
| 2010/0307989 A1 | 12/2010 | Hanel | |

FOREIGN PATENT DOCUMENTS

| | | | | |
|---|---|---|---|---|
| DE | 91 11 388 U1 | | 11/1991 | |
| DE | 9111388 U | * | 3/1993 | B65G 1/127 |
| DE | 198 11 238 A1 | | 9/1999 | |
| DE | 298 24 818 U1 | | 10/2002 | |
| DE | 203 05 773 U1 | | 6/2003 | |
| DE | 102 25 332 A1 | | 1/2004 | |
| DE | 10225332 A1 | * | 1/2004 | B65G 1/12 |
| DE | 10 2007 040 863 A1 | | 3/2009 | |
| DE | 10 2006 023 477 A1 | | 11/2011 | |
| DK | 1466846 T3 | | 9/2009 | |
| EP | 0531669 | | 3/1993 | |
| EP | 1 857 381 A2 | | 11/2007 | |
| JP | H10-067406 | | 3/1998 | |
| JP | 2002-234601 A | | 8/2002 | |
| JP | 2002234601 | * | 8/2002 | B65G 1/00 |
| WO | 2004048230 A2 | | 6/2004 | |

OTHER PUBLICATIONS

International Written Opinion for PCT/EP2011/061774.
German Patent and Trademark Office—Decision to Grant dated Nov. 1, 2013 along with Certified English Translation (5 pages).
German Patent and Trademark Office—Official Communication dated Feb. 1, 2011 along with Certified English Translation (7 pages).
Chinese Office Action in corresponding Chinese Application No. 0088104417 (8 pages) dated Mar. 28, 2014.

* cited by examiner

STORAGE SHELF SYSTEM FOR STORING STORAGE GOODS

The invention relates to a storage shelf system for storing storage goods, comprising at least one service opening for depositing and removing storage goods.

BACKGROUND OF THE INVENTION

In principle, various types of storage shelf units are known. The suitable type of storage shelf unit is selected depending on the storage goods to be stored and the space available for accommodating the storage shelf units. A quick access to the storage goods without any great loss of time is supposed to be possible. Particularly in the case of high-rise storage units, the large dimensions of the storage shelf units can result in long travel times for storage and retrieval.

On the one hand, storage shelf units are known that follow the paternoster principle, which is also frequently referred to as the circulation principle. Moreover, storage shelf units are known which comprise two opposite shelving columns and a transport shaft situated between them, with a rack conveyor traveling up and down in the transport shaft and delivering the storage goods to the storage locations or removing them from the storage locations. These storage shelf units are often referred to as storage lift or vertical storage shelf unit.

Depending on the storage space requirements and the number of storage goods to be stored, several of such storage shelf units are set up, standing side-by-side, in order to form a storage system. Generally, every storage shelf unit has a service opening.

A storage system comprising three storage lifts is known from DE 203 05 773 U1, wherein the storage lifts each have a service opening and these service openings surround a work surface on at least three sides. Every storage lift comprises opposing shelving columns, a central transport shaft and a conveying unit that can be moved within this transport shaft.

However, it has proved disadvantageous that a lot of storage space is lost due to the arrangement of one service opening, respectively, in each of the storage lifts. Moreover, a lot of storage capacity is lost also due to a transport shaft with an associated rack conveyor being provided in each of the storage lifts. Furthermore, in the event that three deposited storage goods items are required, of which each storage goods item is located in a different storage shelf unit, the operator has to operate each storage shelf unit and remove the storage goods item individually from each service opening. Thus, the handling of several storage shelf units and an increased amount of time is required.

SUMMARY OF THE INVENTION

The invention is based on the object of proposing a storage shelf system with which acceptable access times for depositing and retrieving the storage goods, as comprehensive a utilization of space with a lot of storage capacity and, at the same time, ease of operation is obtained.

In order to achieve this object, a storage shelf system for storing storage goods is provided which comprises at least one service opening for depositing and removing storage goods, at least one revolving storage shelf unit with several storage locations, and at least one storage shelf unit which has at least one shelving column with storage locations disposed one above the other. Moreover, at least one transfer device is provided for transporting the storage goods from a storage location of the storage shelf unit to a storage location of the revolving storage shelf unit and vice versa.

Within the context of the present application, the "storage shelf unit" is preferably understood to be a shelving column which provides a plurality of storage locations situated one above the other. Each of these storage locations can accommodate, in particular, a storage goods carrier with the storage goods located thereon. Moreover, several shelving columns can be positioned side-by-side in order to form a shelving row. The storage shelf unit can also be referred to as storage lift or vertical storage shelf unit.

Where the present application refers to a storage goods carrier, this term can be replaced by or supplemented with the storage goods to be transported. Furthermore, the storage goods can relate to a single storage goods element or a combination of several storage goods elements. Preferably, the storage goods to be deposited and retrieved are transported and stored by means of storage goods carriers.

At first, the storage shelf system according to the invention is based on the idea of combining different types of storage shelf units in an overall system, so that there is a good utilization of space with short access times and an interconnection of the different storage shelf units and thus an exchange of storage goods between the storage shelf units is possible. This interconnection makes it possible, for example, that storage goods, which at first are stored in a storage location of the revolving storage shelf unit, can be deposited in a storage location of the storage shelf unit after processing. Moreover, storage goods can also be relocated within the overall system without being delivered to the service opening. For example, storage goods from the region of the revolving storage shelf unit can be relocated or re-sorted into the region of the storage shelf unit and vice versa.

The at least one transfer device is preferably also configured and adapted to transport or move the storage goods from a storage location of the storage shelf unit onto the transfer device and thence to a storage location of the revolving storage shelf unit or into the service opening. Furthermore, the transfer device is configured and adapted to transport or move the storage goods from a storage location of the revolving storage shelf unit onto the transfer device and thence to a storage location of the storage shelf unit or into the service opening. The reverse movements are also supposed to be carried out.

Protection is sought for advantageous embodiments of the storage shelf system according to the invention in the dependent claims.

In a preferred embodiment, a transport shaft, in which the transfer device can be moved in the vertical and/or horizontal direction, is provided between the at least one revolving storage shelf unit and the at least one storage shelf unit. Preferably, the storage shelf system is configured as a high-rise storage unit, with the transport shaft preferably being disposed in the vertical direction and/or preferably approximately centrally in the system. In this manner, it is advantageously possible to quickly deliver the storage goods from a storage location of the revolving storage shelf unit to the service opening of the storage shelf system and/or from a storage location of the storage shelf unit to the service opening by means of the transfer device, which can be moved within the transport shaft. Thus, an efficient storage shelf system can be provided with a high degree of utilization of the available space for storing the storage goods.

In a preferred embodiment, the transfer device comprises a vertical conveyor, preferably in the form of a platform, wherein the storage goods can be moved in the vertical direction by means of the vertical conveyor. Preferably, the vertical conveyor comprises a platform and a driving means, which moves the platform in the vertical direction.

Furthermore, the transfer device can comprise at least one horizontal conveyor, with which the storage goods can be moved in the horizontal direction. Furthermore, it can be provided that the horizontal conveyor is supported on the vertical conveyor. Preferably, the horizontal conveyor can be displaced in the horizontal direction relative to the vertical conveyor. In this way, a transport of the storage goods can take place in the vertical direction and, at the same time, in the horizontal direction. Where reference is made within the context of this application to a horizontal direction, this can mean a first horizontal direction or a second horizontal direction of the horizontal plane.

The transfer device, the horizontal conveyor and/or the vertical conveyor can be configured, for example, as a gripping unit and/or a pulling unit.

For example, in order to deliver several storage goods from different storage locations of the service opening or vice versa simultaneously or at least with an overlap in time, several transfer devices can also be provided in the transport shaft. Furthermore, an individual transfer device can also comprise several vertical conveyors and/or horizontal conveyors.

In another preferred embodiment, the transfer device, preferably the horizontal conveyor, comprises at least one transfer unit to convey the storage goods from a storage location of the revolving storage shelf unit onto the transfer device and from a storage location of the storage shelf unit onto the transfer device, and from the transfer device into the service opening.

Furthermore, the revolving storage shelf unit can comprise a driving means on which a carrying assembly for retaining a storage goods carrier is held by means of a carrying unit.

All of the aforementioned driving means preferably comprise at least one chain drive and/or gear drive.

In a preferred embodiment, the respective carrying assembly is firmly mounted on the associated carrying unit and serves for retaining or receiving a storage goods carrier. Moreover, the respective carrying assembly can be detachably mounted on the associated carrying unit and can serve for retaining the storage goods carrier. In this case, a plug-in connection can be used, for example.

Preferably, the shelving column comprises carrier supports that are situated one above the other and spaced from one another, which are disposed in pairs on opposing side walls of the shelving column in order to form a storage location for the storage goods and/or the storage goods carriers.

In order to form storage locations that are situated one above the other, the storage shelf unit preferably comprises pairs of carrier supports. These carrier supports can be attached to vertical side walls.

Advantageously, the carrier supports are provided on the side walls in a grid-like manner. By defining a certain grid dimension and storing this grid in a control unit of the transfer device, a storage location that is sufficient for a certain storage goods height can be allocated, particularly in connection with a height measuring device. Advantageously, the carrier supports are pressed into the side walls in a meandering fashion. In particular, the side walls are produced from steel sheet and can be welded to vertical shelving posts. In addition or alternatively, the carrier supports can comprise grooves into which the support webs of the storage goods carrier can be inserted and from which they can be extracted. Such support webs can be attached to the side walls of the storage goods carriers.

In a preferred embodiment, shelving posts are provided for retaining the side walls of the storage shelf system, for guiding the transfer device in the vertical direction, for supporting the storage shelf unit and/or for supporting the revolving storage shelf unit.

The shelving posts can be arranged in such a way in the region of the transport shaft that the transfer device, particularly the vertical conveyor, is guided on the shelving posts by means of wheels or rollers. For example, the shelving posts can be provided with guide rails in which the wheels or rollers are guided. Furthermore, it may be provided that a shelving post or several shelving posts are provided both for supporting at least one storage shelf unit or shelving column, as well as for forming the transport shaft with the guide and support for the transfer device.

Predefined storage shelf system units can be provided as modules for the storage shelf system, which, depending on the available space, are then optionally set up side-by-side in order to create a modular system. The modular units set up side-by-side can each function as an individual unit or can be interconnected amongst each other, particularly via the transfer device and/or the transport shaft. In this case, the following embodiments have proved to be particularly advantageous:

In a preferred embodiment, at least two storage shelf units, at least one revolving storage shelf unit and at least one transfer device are provided. In a first variant of this embodiment, preferably two storage shelf units, one revolving storage shelf unit and two transfer devices are included. In another variant, two storage shelf units, two revolving storage shelf units and one transfer device can be provided.

Preferably, the revolving storage shelf unit comprises at least one transfer region via which the storage goods can be fed from the revolving storage shelf unit to the transfer device and vice versa.

This transfer region can be formed in the upper returning region, in the lower returning region, and/or in a region between the upper and lower returning regions of the revolving storage shelf unit.

In other words, the revolving storage shelf unit and the transfer device can be configured and adapted in such a way that the transfer of the storage goods by means of the transfer device between the revolving storage shelf unit and the storage shelf unit takes place in the region of the upper and/or lower returning region of the revolving storage shelf unit. Furthermore, the revolving storage shelf unit and the transfer device can be configured and adapted in such a way that the transfer of the storage goods by means of the transfer device between the revolving storage shelf unit and the storage shelf unit takes place in a region between the upper and/or lower returning regions of the revolving storage shelf unit.

In a preferred further development, a buffer region can preferably be provided in which a transfer device and/or storage goods or a storage goods carrier can be stored temporarily. The storage goods or the storage goods carrier can then be delivered to the service opening or to a storage location later. The buffer region can preferably be disposed in the storage shelf unit, preferably above or underneath the service opening. Furthermore, if several transfer devices are used in the transport shaft, for example, one of the transfer devices can be parked in the buffer region.

The storage shelf system can comprise only one or also several service openings, which proves to be advantageous particularly if the waiting times and/or access times are to be reduced as far as possible. A height measuring device for detecting the height of the storage goods can be provided in the region of the at least one service opening. Such a height measuring device can determine the number of the height units necessary for storing the storage goods.

BRIEF DESCRIPTION OF THE DRAWING FIGURES

The invention is explained in more detail below with reference to the drawings. The Figures schematically show.

DETAILED DESCRIPTION

Figure 1:
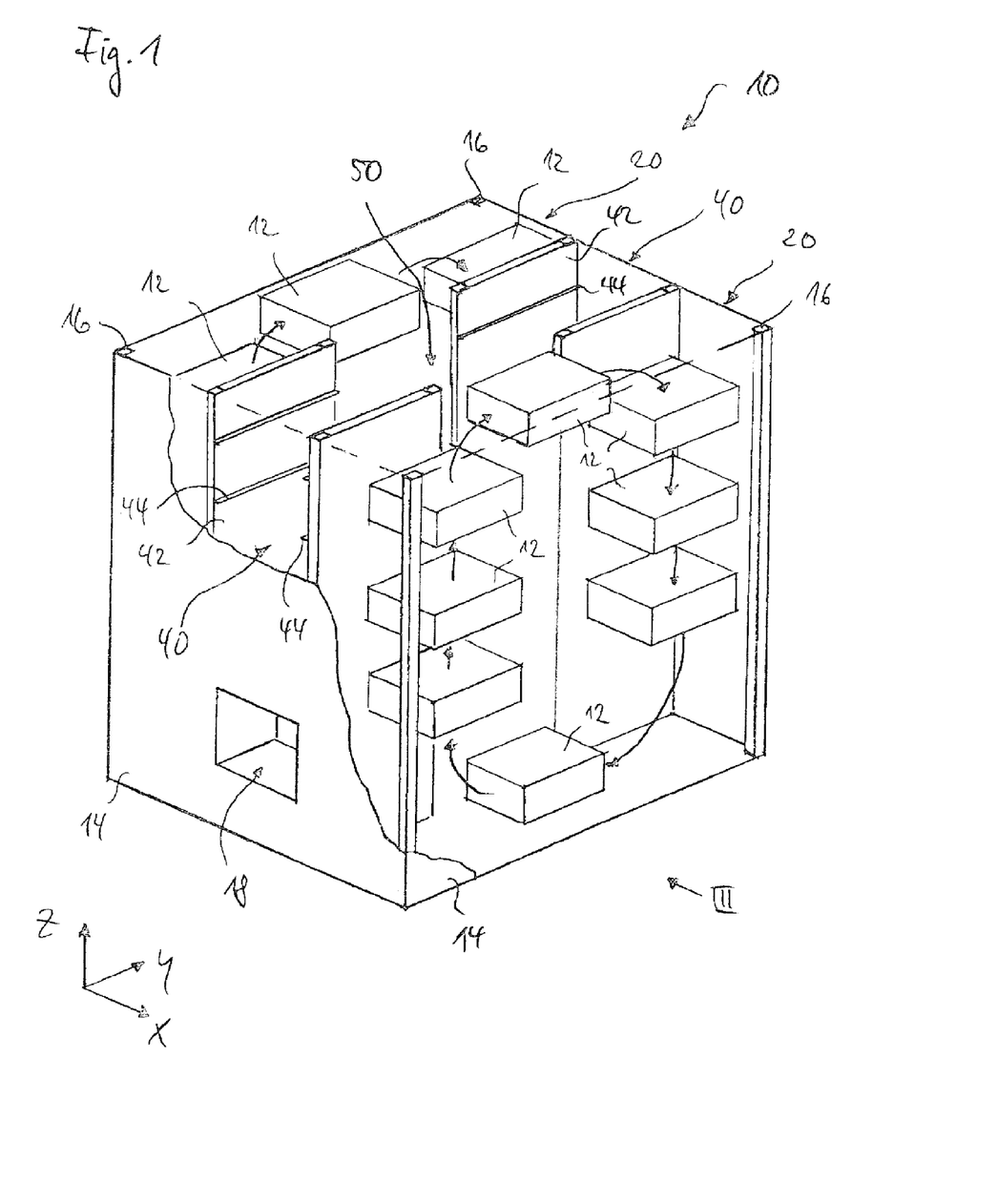
FIG. 1 a perspective view of the first embodiment of the storage shelf system according to the invention.

FIG. 1 shows in a perspective view the schematic structure of a first embodiment of the storage shelf system 10 according to the invention for the storage of storage goods 12. The storage shelf system 10 comprises two revolving storage shelf units 20 and two storage shelf units 40 and a service opening 18 for depositing and removing storage goods 12.

Figure 2:
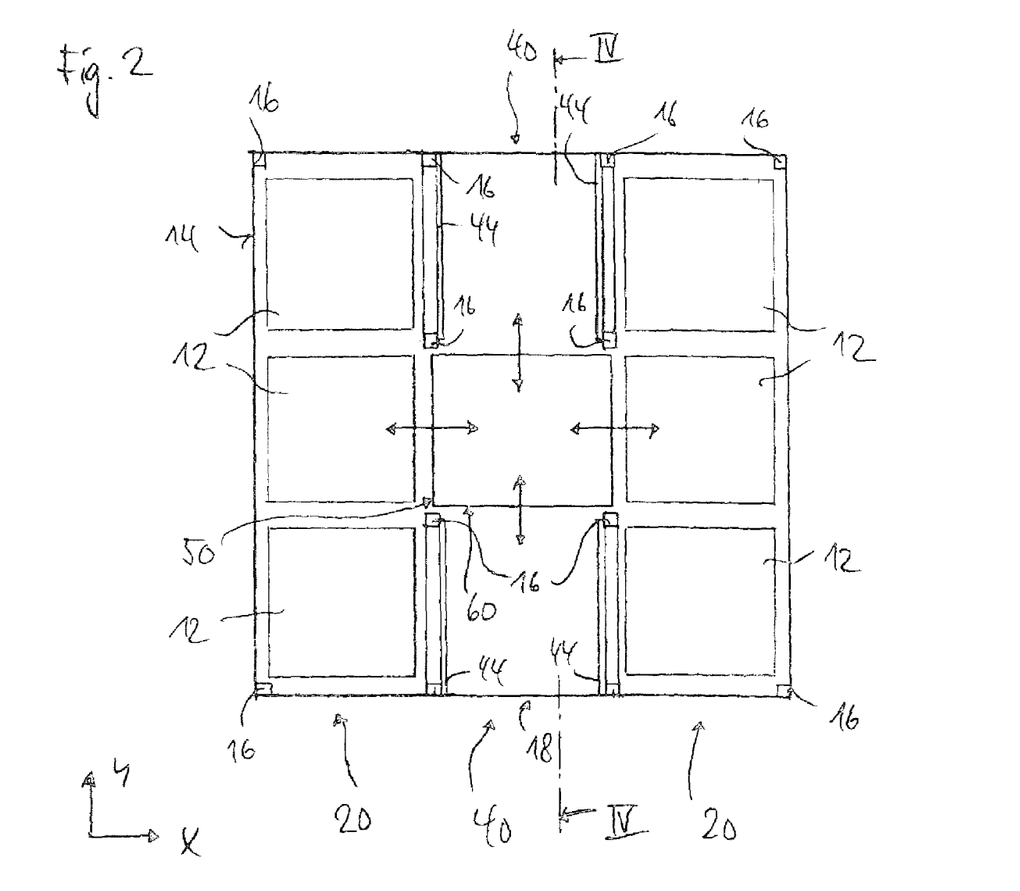
FIG. 2 a top view of the storage shelf system according to FIG. 1.
Figure 3:
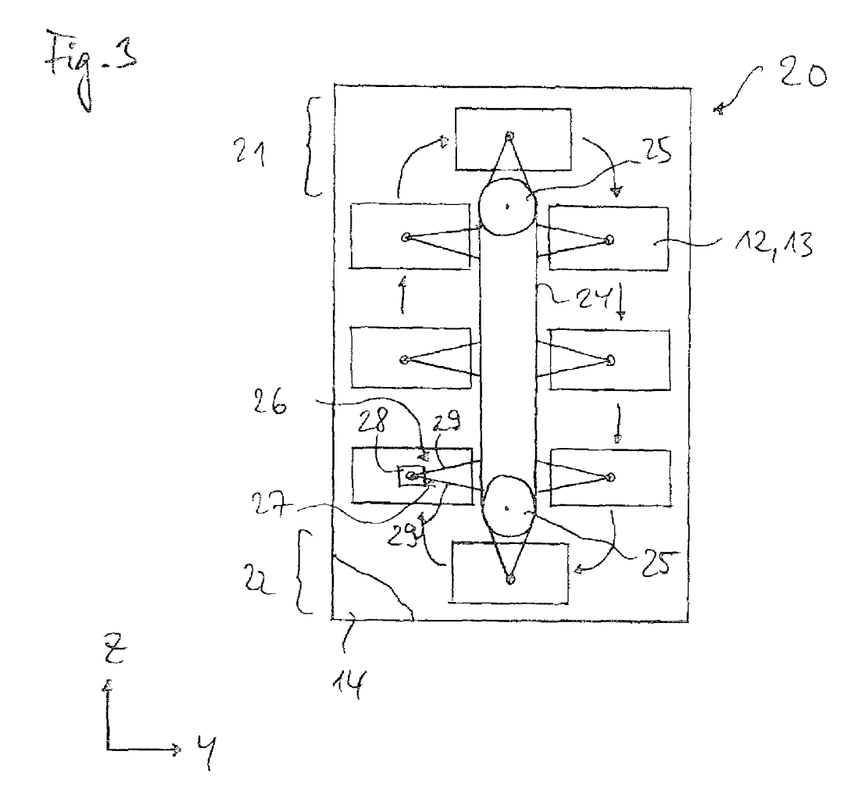
FIG. 3 a side view of the storage shelf system according the arrow III to FIG. 1.

FIG. 2 shows a top view of the storage shelf system 10 according to FIG. 1. FIG. 3 further shows a side view from the outside onto the storage shelf system 10 in the region of the revolving storage shelf unit 20, with the outer wall 14 being depicted in a partial section. A plurality of storage goods 12 is shown in the regions of the revolving storage shelf units 20 in a purely schematic manner in FIGS. 1 to 3. Preferably, the storage goods 12 to be deposited and retrieved are transported and stored by means of storage goods carriers. Therefore, where the description of the Figures refers to storage goods 12, this term can be replaced by or supplemented with the respective storage goods carrier. Furthermore, the storage goods 12 can relate to a single storage goods element or a combination of several storage goods elements. Furthermore, the driving means and the carrying means for the revolving storage shelf units 20 are not shown in FIG. 1 for better reproducibility.

The two storage shelf units 40 are respectively formed by a shelving column with storage locations disposed one above the other. Relative to the service opening 18, one storage shelf unit 40 is disposed in the front region and one storage shelf unit 40 in the rear region of the storage shelf system 10. In order to form the storage locations lying one above the other for the storage goods 12 in the region of the storage shelf units 40, each of the storage shelf units 40 comprises pairs of carrier supports 44. These carrier supports 44 are disposed on opposing side walls 42 of the storage shelf units 40.

Several shelving posts 16 are provided in order to support the storage shelf units 40 and for attaching the side walls 42. As is apparent from FIG. 1, further shelving posts 16 are provided also in the region of the revolving storage shelf units 20, in order to support the revolving storage shelf units 20 and the storage shelf system 10 as a whole, and to attach a peripheral outer wall 14.

Figure 5:
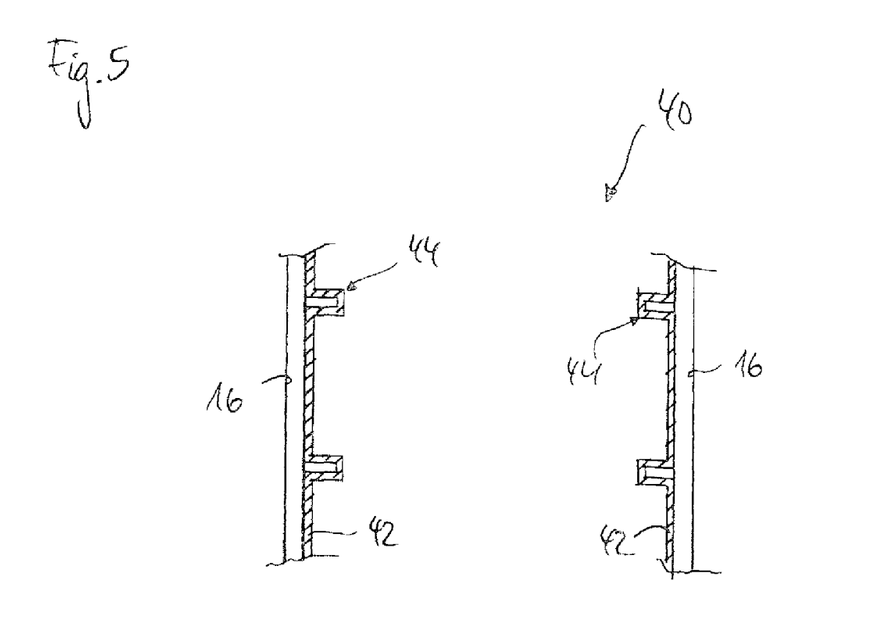
FIG. 5 a cross section through the side walls of the storage shelf unit.

As can be seen particularly from FIG. 5, the carrier supports 44 are provided on the side walls 42 of the storage shelf units 40 in a grid-like manner. The carrier supports 44 are preferably pressed into the side walls 42 in a meandering fashion. In particular, the side walls 42 are produced from steel sheet and can be welded to the vertical shelving posts 16.

As can be seen from FIGS. 1 and 2, in particular, viewed in a first horizontal direction X, a transport shaft 50 is provided between the storage shelf units 40 which extends in the vertical direction Z. Furthermore, viewed in a second horizontal direction Y, this transport shaft 50 is provided between the two revolving storage shelf units 20 and thus, on the whole, approximately in the center of the storage shelf system 10.

A transfer device 60 is provided in the transport shaft 50, by means of which the storage goods 12 or the storage goods carrier can be transported from a storage shelf unit 40 to a revolving storage shelf unit 20 and vice versa. Furthermore, the transfer device 60 is configured to transport or move the storage goods 12 from the respective storage location of a storage shelf unit 40 or a revolving storage shelf unit 20 onto the transfer device 60 and thence into a different storage location within the storage shelf system 10 and/or into the region of the service opening 18. Of course, all of the aforementioned movements are also possible in the reverse direction. The possible horizontal movements are marked with double arrows in FIG. 2. Furthermore, the storage goods 12 can be conveyed in the transport shaft 50 in the vertical direction Z by means of the transfer device 60.

Figure 4:
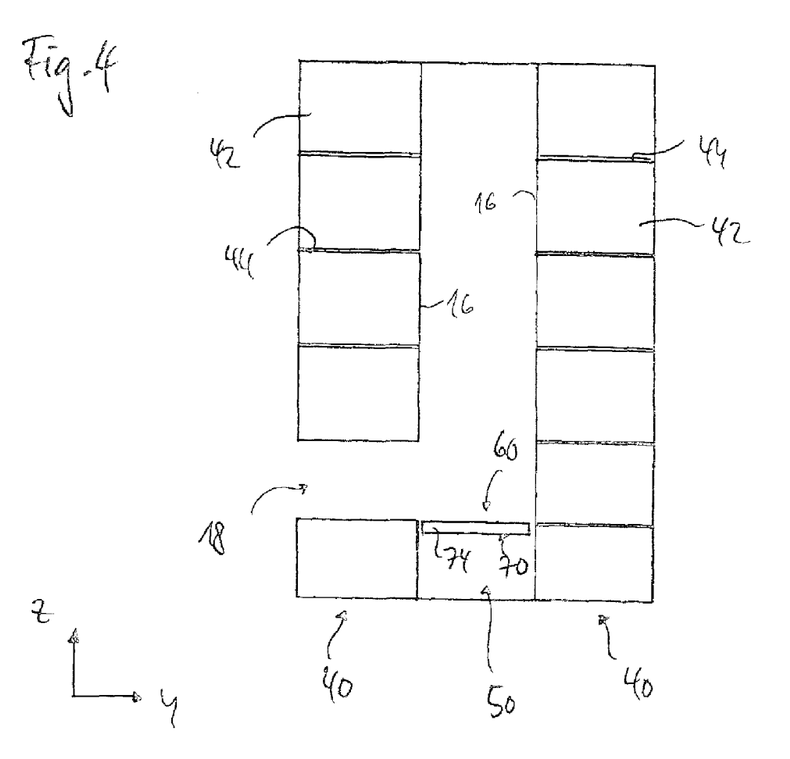
FIG. 4 a cross section according to the line IV-IV in FIG. 2.

The transfer device 60 is apparent, in particular, from FIGS. 2 and 4, and comprises a vertical conveyor 70, by means of which the storage goods can be moved in the vertical direction Z, and at least one horizontal conveyor, by means of which the storage goods can be moved in the first horizontal direction X and/or in the second horizontal direction Y. The vertical conveyor 70 is configured as a platform 74. A chain drive 72 can preferably be provided as a driving means for vertical movement within the transport shaft 50.

Preferably, several gripping units are provided as horizontal conveyors, which can move the storage goods 12 or the storage goods carrier in the direction of the first horizontal direction X and/or of the second horizontal direction Y, as is also made clear by the double arrows in FIG. 2. Storage goods 12 situated in the revolving storage shelf unit 20 can be pulled onto the transfer device 60 by means of these gripping units. From there, the storage goods 12 can be moved in the vertical direction Z in the transport shaft 50 by means of the vertical conveyor 70, and then, for example, pushed into a free storage location of one of the storage shelf units 40. Alternatively, the storage goods 12 can be conveyed from the transfer device 60 into the service opening 18 by means of the horizontal conveyor, particularly one or more gripping units, so that the operator is able to remove the storage goods 12. Furthermore, the transfer device 60 with its horizontal conveyor and its vertical conveyor 70 is configured in such a way that storage goods 12 can be pulled out from a storage location of one of the storage shelf units 40 and onto the transfer device 60 and then into the service opening 18 or into a free storage location of the other or of the same storage shelf unit 40.

FIG. 3 shows a side view of the revolving storage shelf unit 20 according to the arrow III in FIG. 1. In this case, the driving means for generating a revolving movement and several carrying means 26 for retaining the storage goods 12 or storage goods carriers are depicted schematically. The driving means comprise a chain drive 24 with an upper return pulley 25 and a lower return pulley 25. The chain is driven in such a way that the storage goods 12 revolve in the vertical direction in accordance with the paternoster principle and are returned in the region of the upper return pulley 25 as well as in the region of the lower return pulley 25. An upper returning region 21 is located in the region of the upper return pulley 25, and a lower returning region 22 is located in the region of the lower return pulley 25. A possible circulating direction is marked with arrows in FIG. 3. The circulation can also take place in the reverse direction.

Several carrying means 26 for retaining the storage goods carriers are provided on the chain drive 24. Each carrying means 26 comprises a carrying unit 27 which comprises at least one, preferably several, in particular two or four carrying arms 29, in order to be able to hold a carrying assembly 28, the storage goods carrier and/or the storage goods 12. At their respective ends, the carrying arms 29 are attached in an articulated manner to the chain and the carrying assembly 28, so that the semi-circular returning movements in the upper returning region 21 and in the lower returning region 22 can take place. Furthermore, a guide rail can be provided for guiding the ends of the carrying arms 29 on the side of the storage goods (not shown). In the first embodiment of the storage shelf system 10, it is provided that the transfer of the storage goods 12 between the revolving storage shelf unit 20 and the storage shelf unit 40 takes place in the upper returning region 21 or in the lower returning region 22 by means of the above-mentioned gripping units of the horizontal conveyor of the transfer device 60.

In a first variant of the above-mentioned carrying means 26, the respective carrying assembly 28 is firmly mounted on the associated carrying unit 27 and serves for retaining the storage goods carrier. Preferably, this carrying assembly 28 is permanently firmly attached to the carrying arms 28. In a second variant, the respective carrying assembly 28 is detachably mounted on the associated carrying unit 27, i.e. the carrying arms 29. For example, the carrying assembly 28 can be detachably mounted by means of a plug-in connection.

Preferably, the shelving posts 16 disposed in FIG. 1 in the corner regions of the transport shaft 50 comprise guide means in order to enable a vertical guidance of the transfer device 60, particularly of the vertical conveyor 70, in the vertical direction Z. For this purpose, it can be provided, in particular, that the vertical conveyor 70 is equipped with guide rollers guided in vertical guide rails along the shelving posts 16.

Figure 6:
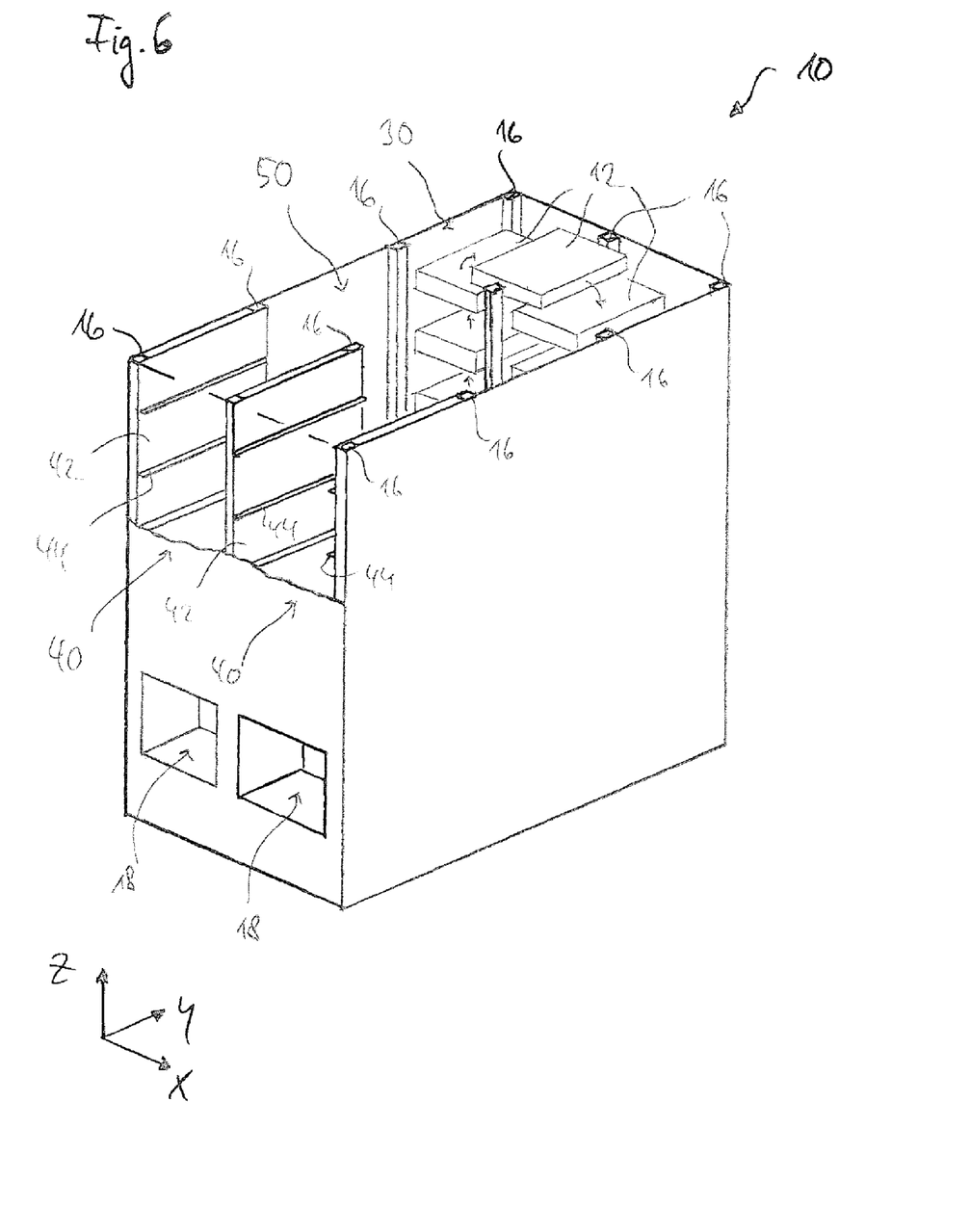
FIG. 6 a perspective view of the second embodiment of the storage shelf system according to the invention.
Figure 7:
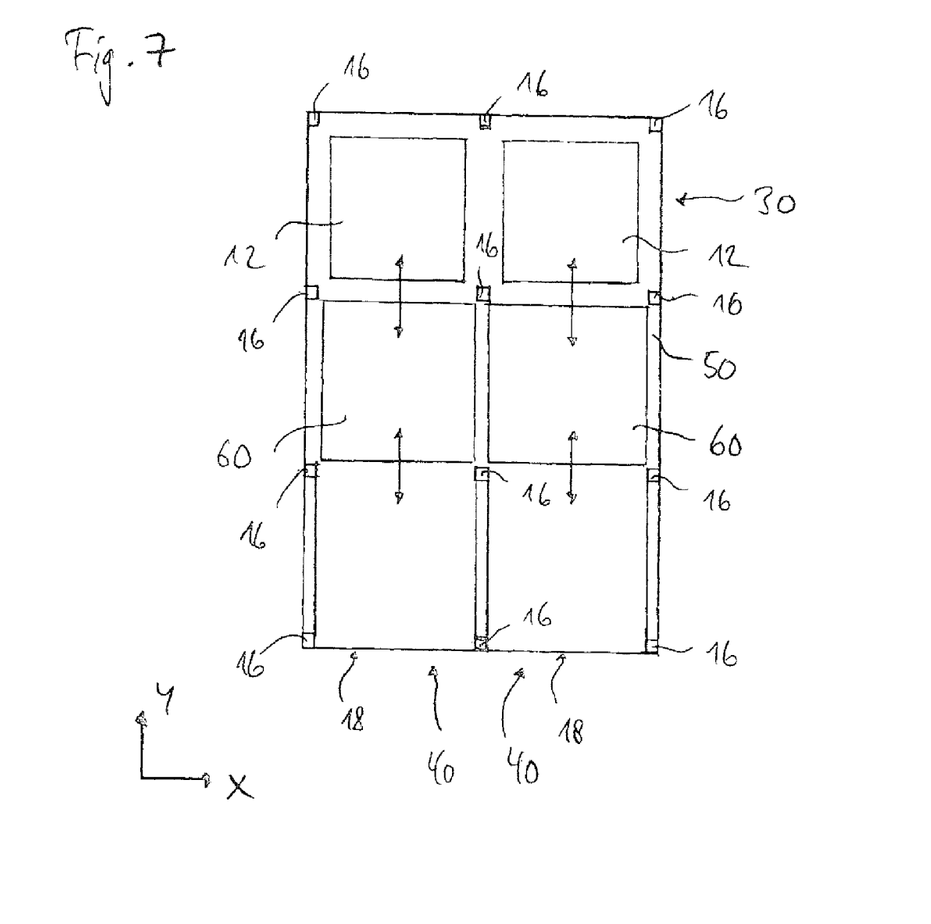
FIG. 7 a horizontal section through the second embodiment according to FIG. 6.

FIG. 6 shows in a perspective view the schematic structure of a second embodiment of the storage shelf system 10 according to the invention for the storage of storage goods 12. The storage shelf system 10 comprises a revolving storage shelf unit 30 and two storage shelf units 40 with one service opening 18 each for depositing and removing storage goods 12. However, only a single service opening 18 can also be provided. In a schematic representation, FIG. 7 shows a horizontal section through this second embodiment according to FIG. 6, with the horizontal section extending at the level of the service openings 18. In the front region of the storage shelf system 10, the two storage shelf units 40 are arranged side-by-side. With regard to their structure, these storage shelf units 40 correspond to the front storage shelf unit 40 of the first embodiment according to FIG. 1. Thus, these storage shelf units 40 comprise carrier supports 44 provided in pairs and respectively disposed on the side walls 42, for forming storage locations situated one above the other.

A revolving storage shelf unit 30 which extends along the horizontal direction X is provided in the rear region of the storage shelf system 10. In principle and with regard to its schematic structure, this revolving storage shelf unit 30 corresponds to the two revolving storage shelf units 20 of the first embodiment (see FIGS. 1 to 3). Thus, reference may be made at first to the above explanations. In contrast to the first embodiment, two transfer devices 60 are provided in the second embodiment according to FIGS. 6, 7, which are each configured in the same way as the transfer device 60 explained above with regard to the first embodiment according to FIG. 1. The measures for guiding the two transfer devices 60 in the transport shaft 50 by means of guide rails attached to the shelving posts are configured and adapted accordingly. Another difference with respect to first embodiment is that in the second embodiment, the storage goods carriers are removed by means of the transfer device(s) 60 from a storage location of the revolving storage shelf unit 30 and conveyed onto the transfer device 60, not in the region of an upper or lower returning region, but in a central region between the upper and lower returning regions. This is apparent from the double arrows in the horizontal direction Y in FIG. 7. The removed storage goods 12 can then be moved by means of the transfer device 60 in the vertical direction Z in the transport shaft 50 and deposited in a storage location of the storage shelf unit 40 above or underneath the service opening 18. From the transfer device 60, the storage goods 12 can be pushed into the service opening 18.

In a development of the second embodiment according to FIGS. 6, 7, it can be provided that the two transfer devices 60 are additionally configured in such a way that a transfer of the storage goods and/or of the storage goods carrier from the one transfer device 60 onto the other transfer device 60 and vice versa in the horizontal direction X is possible.

Figure 8:
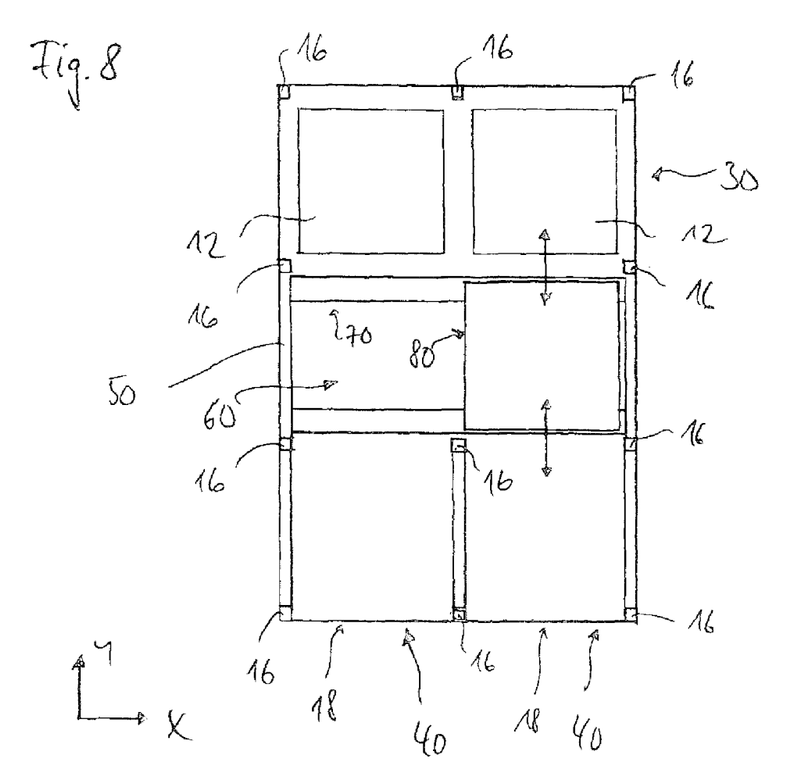
FIG. 8 a horizontal section through a third embodiment of the storage shelf system according to the invention, and FIG. 9 a perspective schematic representation of the transfer device used in FIG. 8.

FIG. 8 shows a horizontal, schematic section through a third embodiment of the storage shelf system 10 according to the invention, with the horizontal section extending at the level of the service opening 18. In the front region of the storage shelf system 10, two storage shelf units 40 are arranged side-by-side, which each comprise a service opening 18. However, only a single service opening 18 can also be provided. In contrast to the second embodiment according to FIGS. 6, 7, only one transfer device 60 is provided in the transport shaft 50 in the third embodiment, which is also shown schematically in a perspective view in FIG. 9. This transfer device 60 comprises as a vertical conveyor 70 a lifting platform which is preferably formed by two spaced-apart, parallel carrier beams 76 (also see FIG. 9). The horizontal conveyor 80 is movably mounted on the vertical conveyor 70, particularly on the two carrier beams 76, is supported by it and can be moved relative to the vertical conveyor 70 in the first horizontal direction X.

Figure 9:
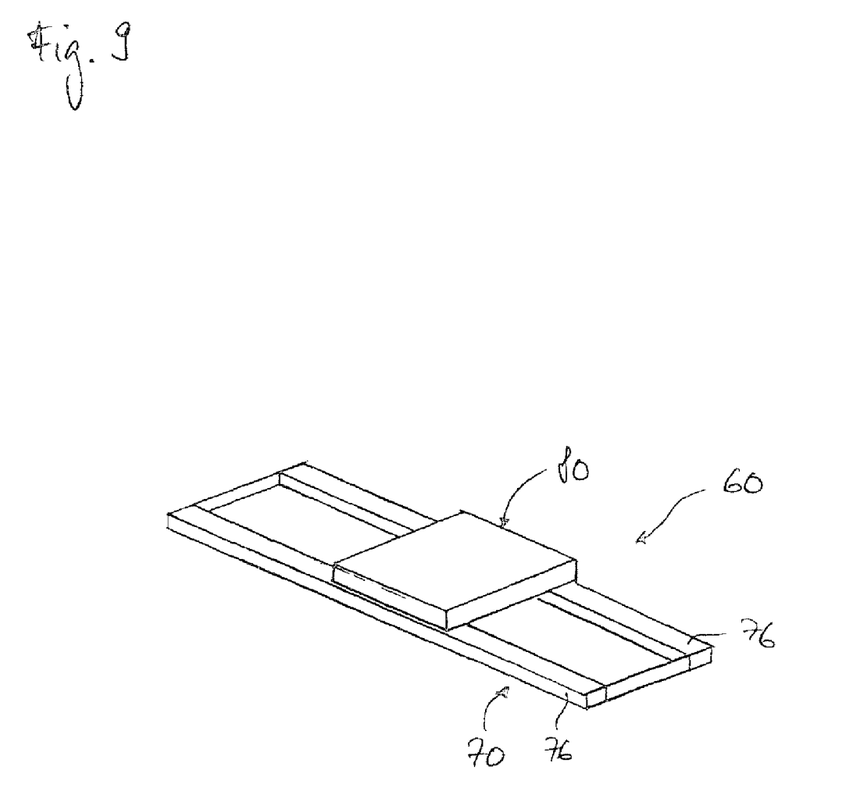

This horizontal conveyor 80, like the horizontal conveyor discussed above with respect to the first embodiment, furthermore comprises at least one gripping unit for moving the storage goods carriers from the transfer device 60 into a storage location of the storage shelf unit 40 or into a storage location of the revolving storage shelf unit 30 or into one of the service openings 18, and in each case vice versa. In the process, one gripping unit or several gripping units, for example, can be used for this horizontal movement of the storage goods carriers into the storage location and out from the storage location in the first horizontal direction X and/or in the second horizontal direction Y.

Moreover, combinations of the individual revolving storage shelf units 20 or 30 with the storage shelf units 40 and the various transfer devices 60 are also possible. Furthermore, based on the embodiments discussed above, predefined storage shelf system units can be provided as modules, which, depending on the available space, are then optionally set up side-by-side in order to create a modular system. These modular units, which are set up side-by-side, can then function as individual units, for example with one service opening each, or can be interconnected amongst each other, particularly via one or more transfer devices 60 and/or one or more transport shafts 50. For example, the embodiments shown in FIGS. 7 and 8 can each form such a modular unit, so that several such modular units can then be arranged side-by-side, particularly along the horizontal direction X, in order to form a storage shelf system. In particular in the embodiment according to FIG. 8, a common transport shaft 50 can be provided in which only one transfer device 60 is used.

The above-described embodiments of the storage shelf system 10 are characterized, in particular, in that the loss of storage capacity is minimized by arranging a central, in particular centrally disposed, transport shaft 50 together with the transfer device 60. Moreover, an interconnection of different types of storage shelf units is accomplished, so that it is no longer necessary to operate each individual shelf and remove the storage goods respectively placed in the service opening 18 individually. These leads to a reduction of the time required. On the whole, a good utilization of space with a lot of storage capacity and, at the same time, ease of operation is obtained, preferably with only a single operator.

| List of Reference Symbols | |
|---|---|
| 10 | Storage shelf system |
| 12 | Storage goods |
| 14 | Outer wall |
| 16 | Shelving post |
| 18 | Service opening |
| 20 | Revolving storage shelf unit |
| 21 | Returning region |
| 22 | Returning region |
| 24 | Chain drive |
| 25 | Return pulley |
| 26 | Carrying means |
| 27 | Carrying unit |
| 28 | Carrying assembly |
| 29 | Carrying arm |
| 30 | Revolving storage shelf unit |
| 40 | Storage shelf unit |
| 42 | Side wall |
| 44 | Carrier support |
| 50 | Transport shaft |
| 60 | Transfer device |
| 70 | Vertical conveyor |
| 72 | Chain drive |
| 74 | Platform |
| 76 | Carrier beam |
| 80 | Horizontal conveyor |
| X | First horizontal direction |
| Y | Second horizontal direction |
| Z | Vertical direction |

The invention claimed is:

1. A storage shelf system for storing storage goods, comprising
  a service opening for depositing and removing storage goods,
  a revolving storage shelf unit with several movable storage locations, the revolving storage shelf unit including upper and lower returning regions through which the movable storage locations are rotated about respective horizontal axes that are spaced apart from each other in a vertical direction,
  a storage shelf unit which has at least one shelving column with fixed storage locations disposed one above the other in the vertical direction,
  a transfer device arranged for transporting the storage goods: (a) from one of the movable storage locations of the revolving storage shelf unit onto the transfer device and thence into the service opening and vice versa, (b) from one of the fixed storage locations of the storage shelf unit onto the transfer device and thence directly into the service opening and vice versa, and (c) from one of the fixed storage locations of the storage shelf unit onto the transfer device and thence to one of the movable storage locations of the revolving storage shelf unit and vice versa,
  the transfer device providing for transporting the storage goods along the vertical direction and along a horizontal direction of the horizontal axes of the revolving storage shelf unit,
  a transport shaft, in which the transfer device can be moved in the vertical and horizontal directions, and
  a transfer region being formed between the transport shaft and one of (a) the upper returning region, (b) the lower returning region, and (c) a region between the upper and lower returning regions, the transfer device being movable through the transfer region in the horizontal direction for depositing the storage goods in the movable storage locations of the revolving storage shelf unit and retrieving the storage goods from the movable storage locations of the revolving storage shelf unit.

2. The storage shelf system according to claim 1, in which the revolving storage shelf unit is a first of two revolving storage shelf units separated by the transport shaft, a second of the revolving storage shelf units including upper and lower regions through which the movable storage locations of the second revolving storage shelf unit are rotated about respective horizontal axes that are spaced apart from each other in the vertical direction, and the horizontal axes of the second revolving storage shelf unit extend in the same horizontal direction as the horizontal axes of the first revolving storage shelf unit.

3. The storage shelf system according to claim 2, in which the transfer device provides for depositing the storage goods in the movable storage locations of each of the first and second revolving storage shelf units and retrieving the storage goods from the movable storage locations of each of the first and second revolving storage shelf units by transporting the storage goods in the horizontal direction.

4. The storage shelf system according to claim 3, in which the horizontal direction is a first of two orthogonal horizontal directions, and the transfer device provides for transporting the storage goods to and from the service opening by transporting the storage goods in a second of the two orthogonal horizontal directions.

5. The storage shelf system according to claim 4, in which the transfer device provides for depositing the storage goods in the fixed storage locations of the storage shelf unit and retrieving the storage goods from the fixed storage locations of the storage shelf unit by transporting the storage goods in the second of the two orthogonal horizontal directions.

6. The storage shelf system according to claim 2, in which the second revolving storage shelf unit includes a transfer region, and the transfer regions of both the first and second revolving storage shelf units are formed between the transport shaft and one of the upper and lower returning regions of each of the revolving storage shelf units through which the transfer unit is movable in the horizontal direction for depositing the storage goods in the movable storage locations of the revolving storage shelf units and retrieving the storage goods from the movable storage locations of the revolving storage shelf units.

7. The storage shelf system according to claim 6, in which the horizontal direction is a first of two orthogonal horizontal directions, and the storage shelf unit is a first of two storage shelf units separated by the transport shaft along a second of the two horizontal directions.

8. The storage shelf system according to claim 1, in which the storage shelf unit and the revolving storage shelf unit are separated by the transport shaft in the horizontal direction, and the transfer device provides for transporting the storage goods between the fixed storage locations of the storage shelf unit and the movable storage location locations of the revolving storage shelf unit by transporting the storage goods along the horizontal direction, including depositing the storage goods in the fixed storage locations of the storage shelf unit and retrieving the storage goods from the fixed storage locations of the storage shelf unit by transporting the storage goods in the horizontal direction.

9. The storage shelf system according to claim 1, further comprising shelving posts that provide for (a) retaining the side walls of the storage shelf system, (b) guiding the transfer device in the vertical direction, (c) supporting the storage shelf unit, and (d) supporting the revolving storage shelf unit.

10. The storage shelf system according to claim 8, in which the transfer region is formed in the region between the upper and lower returning regions.

11. The storage shelf system according to claim 1, in which the service opening and the revolving storage shelf unit are separated by the transport shaft in the horizontal direction, and the transfer device provides for transporting the storage goods between the service opening and the movable storage location locations of the revolving storage shelf unit by transporting the storage goods along the horizontal direction.

12. The storage shelf system according to claim 11, in which the service opening is a first of two service openings and the second service opening and the revolving storage shelf unit are separated by the transport shaft in the horizontal direction, and the transfer device provides for transporting the storage goods between the second service opening and the movable storage location locations of the revolving storage shelf unit by transporting the storage goods along the horizontal direction.

13. The storage shelf system according to claim 12, in which the horizontal direction is a first of two orthogonal horizontal directions, and the transfer device provides for transporting the storage goods between the first and second service openings along a second of the two horizontal directions.

14. The storage shelf system according to claim 1, in which the horizontal direction is a first of two orthogonal horizontal directions, and the transfer device provides for transporting the storage goods to and from the service opening by transporting the storage goods in a second of the two orthogonal horizontal directions.

15. The storage shelf system according to claim 14, in which the transfer unit provides for conveying the storage goods from a storage location of the storage shelf unit onto the transfer device and from the transfer device into the service opening by transporting the storage goods in the second of the two orthogonal horizontal directions.

16. The storage shelf system according to claim 1, in which the revolving storage shelf unit comprises a drive supporting a carrying assembly for retaining a storage goods carrier, and the drive comprises a chain drive and/or a gear drive.

17. The storage shelf system according to claim 16, in which the carrying assembly is detachably mounted on the associated carrying unit and serves for retaining the storage goods carrier.

18. The storage shelf system according to claim 1, further comprising
shelving posts that provide for (a) retaining the side walls of the storage shelf system, (b) guiding the transfer device in the vertical direction, (c) supporting the storage shelf unit and (d) supporting the revolving storage shelf unit,
the transfer device including a vertical conveyer, and
the vertical conveyer being guided by rollers on the shelving posts.

19. The storage shelf system according to claim 11, in which the service opening is a first of two service openings and a second of the two service openings and the revolving storage shelf unit are separated by the transport shaft in the horizontal direction, the transfer device is a first of two transfer devices, and a second of the two transfer devices provides for transporting the storage goods between the second service opening and the movable storage location locations of the revolving storage shelf unit by transporting the storage goods along the horizontal direction.

20. The storage shelf system according to claim 19 in which the transfer region is a first of two transfer regions and the second transfer device is movable through a second of the two transfer regions in the horizontal direction for depositing the storage goods in the movable storage locations of the revolving storage shelf unit and retrieving the storage goods from the movable storage locations of the revolving storage shelf unit.

21. The storage shelf system according to claim 20 in which the first and second transfer regions are formed between the transport shaft and the region between the upper and lower returning regions of the revolving storage shelf unit.

* * * * *